United States Patent [19] [11] 4,314,870
Ishida et al. [45] Feb. 9, 1982

[54] METHOD OF MOUNTING ELECTRONIC COMPONENTS

[75] Inventors: Toshimichi Ishida, Kadoma; Takeo Takayanagi, Nara; Yasuo Taki, Hirakata, all of Japan

[73] Assignee: Matsushita Electric Industrial Co., Ltd., Kadoma, Japan

[21] Appl. No.: 121,145

[22] Filed: Feb. 13, 1980

[30] Foreign Application Priority Data

Feb. 19, 1979 [JP] Japan .................................. 54-18144

[51] Int. Cl.³ ............................................. B29C 19/02
[52] U.S. Cl. ..................................... 156/272; 29/834; 156/155; 156/291; 156/292; 156/578; 228/175
[58] Field of Search ................ 29/832, 834; 228/175, 228/212; 156/155, 578, 291, 292, 272; 339/17 B, 17 C; 361/387

[56] References Cited

U.S. PATENT DOCUMENTS

| | | | |
|---|---|---|---|
| 2,983,853 | 5/1961 | Williams | 29/832 X |
| 3,294,951 | 12/1966 | Olson | 29/832 X |
| 3,666,588 | 5/1972 | Wanesky | 156/155 |
| 3,704,515 | 12/1972 | Nelson | 29/834 |
| 3,785,903 | 1/1974 | Boyer et al. | 156/578 X |
| 3,834,966 | 9/1974 | Kelly | 156/578 X |
| 3,933,187 | 1/1976 | Marlinski | 156/578 X |
| 3,966,110 | 6/1976 | Boynton | 228/175 |

Primary Examiner—Francis S. Husar
Assistant Examiner—C. J. Arbes
Attorney, Agent, or Firm—Whittemore, Hulbert & Belknap

[57] ABSTRACT

In a method of mounting an electronic component wherein the electronic component is temporarily mounted on a printed circuit board before the component is securely mounted on the base plate by soldering, the improvement comprises steps of delivering adhesive to the front end of a coating head of an adhesive applicator, transferring the adhesive on to the printed circuit board between connection lands provided thereon for placement of the electronic component, and then positioning the electronic component on the adhesive applied to allow the electronic component to be held in position, with its bottom surface and a part of its side surface put in contact with the adhesive. The electronic component is thus mounted temporarily on the printed circuit board.

4 Claims, 11 Drawing Figures

METHOD OF MOUNTING ELECTRONIC COMPONENTS

This invention relates to a method of positioning and temporarily mounting a leadless-type electronic component on a printed circuit board before soldering the component to the board.

In temporarily mounting a leadless type electronic component (hereinafter referred to as an electronic component), such as a chip resistor, chip capacitor or the like, on a printed circuit board there has heretofore been used a method wherein a spread of adhesive in sheet form or a length of adhesive tape is applied to the printed circuit board at a position predetermined for mounting the electronic component thereon and then the electronic component is placed on the adhesive-applied surface.

However, this method has a disadvantage in that it provides no sufficient holding power because the electronic component is held in position on its bottom surface only, which fact may lead to the electronic component falling off in the course of the subsequent stage of soldering or the like operation.

If an adhesive in liquid form is used, it contacts the side surfaces of the electronic component as well as its bottom, which provides more secure adhesion for temporary mount, thus eliminating the aforesaid disadvantage. With screen printing techniques as conventionally employed in feeding liquid adhesive on to printed circuit board, however, it is impracticable to use any printed circuit board unless it is free of raised objects before introduction of any component, and adhesives suitable for use are limited to those whose viscosity is up to about 200,000 cPs. Therefore, if a spread of adhesive is to be maintained in the form as applied, the thickness of the spread is necessarily limited, and when an electronic component is placed in position for temporary mount, it contacts the adhesive on its bottom surface only as above pointed out. This tends to cause the trouble of separation or falling off.

It is a primary object of the present invention to provide an improved method for adhesive application which eliminates the above said disadvantages of the conventional method and which permits temporarily mounting of an electronic component on a printed circuit board on to which electronic components having lead wires are already introduced, by application of an adhesive material.

It is another object of the invention to provide a method of mounting an electronic component which permits application of an adhesive having a higher degree of viscosity, in a greater spread thickness, so that the adhesive contacts and holds the electronic component in position on its bottom surface and on a part of its side surface to provide a highly reliable temporary mount.

Now, preferred forms of the invention will be described below with reference to the accompanying drawings, wherein.

Figure 1A:
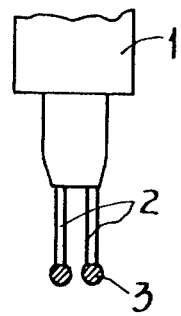
FIGS. 1a and 1b show the manner in which adhesive application is carried out according to one form of the invention.
Figure 1B:
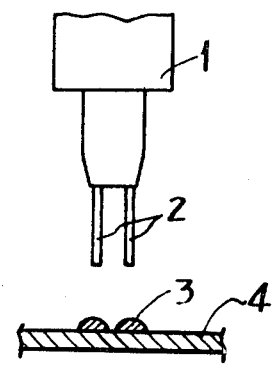

Referring first to FIGS. 1a and 1b, there is shown a form of the invention, that is, the manner in which drops of adhesive from the front end of an adhesive coating head are transferred on to a printed circuit board between connection lands provided thereon for placement of an electronic component. The coating head includes a plurality of small-diameter pipes through which adhesive is supplied at a constant rate and in very small quantities. In the form of the invention shown in these drawings, the adhesive is allowed to travel under pressure through a plurality of small-diameter pipes 2 provided at the front portion of coating head 1 of an adhesive applicator means for a very short period of time and until it is discharged at the tip of each small diameter pipe 2 to form a drop of adhesive 3 as shown in FIG. 1a. Then, the adhesive 3 is transferred on to the printed circuit board 4 by moving the coating head 1 relative to the printed circuit board 4 to press the drop of adhesive 3 against a printed circuit board 4 at predetermined position, and a mound of adhesive spread 3 is formed on the printed circuit board 4 as shown in FIG. 1b.

Figure 2A:
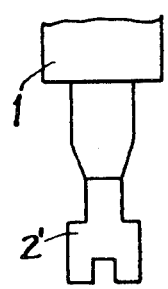
FIGS. 2a to 2c show the manner in which adhesive application is carried out according to another form of the invention.
Figure 2B:
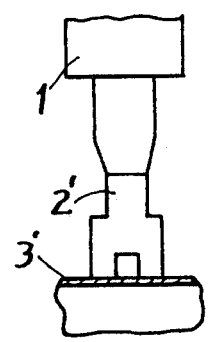
Figure 2C:
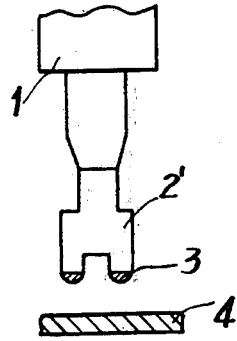

FIGS. 2a to 2c illustrate another form of method according to the invention, for delivery of adhesive to the front end of the coating head. FIG. 2a shows a coating head 2' prior to the adhesive being shifted to the front end of the coating head 2'. FIG. 2b shows the front end of the coating head 2' in contact relation with an adhesive layer 3' on a mat, and FIG. 2c shows drops of adhesive 3 at the front end of the coating head 2' into which a feed of adhesive 3 has been introduced. The appearance of the adhesive transferred on to the printed circuit board 4 is just as shown in FIG. 1b. In the form of the invention as shown in FIGS. 2a to 2c, the coating head 2' has a pattern analogous to that of a coat pattern provided on the printed circuit board. An adhesive layer 3' is seen as prepared, on a mat, in a uniform thickness by an adhesive applicator means.

Figure 3:
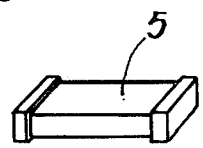
FIG. 3 is a perspective view of a chip capacitor.
Figure 4:
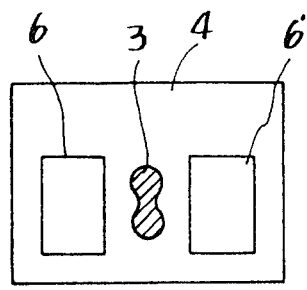
FIG. 4 is a top plan view showing the form and position of an adhesive spread applied.
Figure 5:
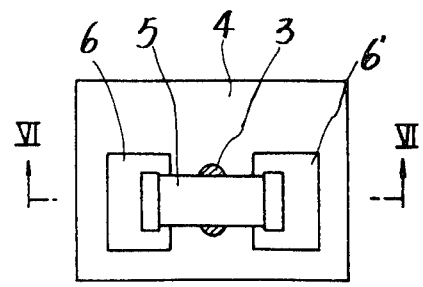
FIG. 5 is a top plan view of an electronic component held in position by contact with an adhesive spread applied and then soldered.
Figure 6:
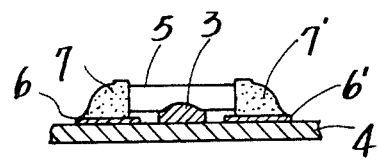
FIG. 6 is a sectional view taken on the line VI—VI of FIG. 5.

FIG. 3 shows a chip capacitor 5 taken as a typical example of a leadless type electronic component, both ends of the capacitor 5 serving as electrodes. In FIG. 4 is seen an adhesive spread 3 applied by the coating head 1 on to the printed circuit board 4 between connection lands 6, 6' provided thereon for placement of the electronic component; and as shown in FIGS. 5 and 6, the chip capacitor 5 is held in position with its bottom surface and a part of its side surface brought in contact with the adhesive 3. This eliminates the possibility of the chip capacitor 5 slipping out of position in the course of effecting soldering at 7 and 7'. The adhesive 3 should be of ultraviolet curing or thermosetting type acrylic material and must be cured prior to soldering. Such type of adhesive may be used in the viscosity range of 100,000 to 600,000 cPs and most preferably in the region of 400,000 cPs.

Figure 7:
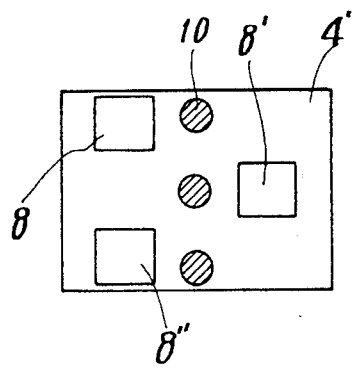
FIG. 7 is a top plan view showing arrangements prior to mounting of an electronic component according to still another form of the invention.
Figure 8:
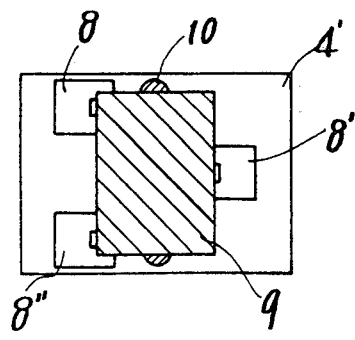
FIG. 8 is a top plan view of an electronic component held in position by contact with adhesive spreads applied in the form of the invention shown in FIG. 7.

FIGS. 7 and 8 show still another form of the invention, from which it is seen that different patterns of adhesive coat can be selectively designed by changing the configuration of the adhesive coating head. AT 4', there is shown a printed circuit board having electronic-component connection lands 8, 8', on which is placed another leadless type of electronic component 9. A plurality of adhesive coats 10 are applied at different positions so that the electronic component 9 can be held in position by contact with the adhesive coats 10 at its bottom surface and also at a part of its side surface.

As can be clearly seen from the above description, according to the present invention, the adhesive is transferred by the adhesive coating head on to the printed circuit board at a constant rate and in very small quantities, higher viscosity adhesives can also be readily used. Moreover, since the invention makes it possible to apply the adhesive to the printed circuit board at a predetermined position, it is possible to mount an electronic component on a printed circuit board which has been loaded with electronic components having lead wires by using an adhesive for temporary mounting. Further, it is possible to apply adhesive to the printed circuit board at any selected position by positioning the printed circuit board automatically with respect to the adhesive coating head. This, combined with a positioning device for feed of electronic components, permits a high-speed, rationalized mounting operation for electronic components.

What is claimed is:

1. A method of mounting an electronic component of leadless type onto a printed circuit board comprising the steps of applying adhesive to the board at least at two locations and between connection lands provided on the board, said two locations being spaced by a distance not less than but substantially equal to the width of the electronic component, placing the electronic component on the adhesive to retain it in position with its bottom surface and part of its side surfaces in contact with the adhesive, and curing the adhesive by ultraviolet rays or heat, thereby temporarily holding the electronic component on the board before soldering it thereto.

2. A method of mounting an electronic component having a bottom surface of predetermined width onto a printed circuit board comprising the steps of applying adhesive to the board at least at two locations wherein the remote edges of the adhesive at said two locations are spaced apart a distance greater than the width of said bottom surface and the near proximity of the adhesive at said two locations is less than the width of said bottom surface, and placing the electronic component on the adhesive between the remote edges thereof with it bottom surface and at least part of its side surface in contact with the adhesive thereby temporarily holding the electronic component on the board.

3. A method as defined in claim 1 or 2, wherein a layer of adhesive having uniform thickness is preliminarily prepared by an adhesive supply means, a coating head having projections in corresponding relation to said locations is brought into contact with the adhesive layer to supply a specific small amount of adhesive onto each of the projections, and the adhesive on the projections is transferred to said locations.

4. A method as defined in claim 1 or 2, wherein a specified small amount of adhesive is supplied under pressure to the front end of each of small-diameter pipes projecting from a coating head, the pipes being spaced in corresponding relation to said locations, and the adhesive at the front ends of the pipes is transferred to said locations.

* * * * *